United States Patent
Sonobe et al.

(10) Patent No.: US 11,302,373 B2
(45) Date of Patent: Apr. 12, 2022

(54) RACE TRACK MAGNETIC MEMORY DEVICE AND WRITING METHOD THEREOF

(71) Applicant: Samsung Electronics Co., Ltd., Suwon-si (KR)

(72) Inventors: Yoshiaki Sonobe, Yokohama (KR); Syuta Honda, Suwon-si (KR); Teruo Ono, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 17/076,300

(22) Filed: Oct. 21, 2020

(65) Prior Publication Data

US 2021/0125653 A1     Apr. 29, 2021

(30) Foreign Application Priority Data

Oct. 29, 2019   (JP) .............................. JP2019-196645

(51) Int. Cl.
*G11C 11/16*      (2006.01)
*H01L 27/22*      (2006.01)
(Continued)

(52) U.S. Cl.
CPC ........ *G11C 11/1675* (2013.01); *G11C 11/161* (2013.01); *G11C 11/18* (2013.01);
(Continued)

(58) Field of Classification Search
CPC ... G11C 11/1675; G11C 11/161; G11C 11/18; H01L 43/04; H01L 43/06; H01L 27/222
See application file for complete search history.

(56) References Cited

U.S. PATENT DOCUMENTS 7,626,844 B1   12/2009  Moriya et al.
7,738,278 B2 *  6/2010  Kim ....................... G11C 11/15
                                                         365/80
(Continued)

FOREIGN PATENT DOCUMENTS

EP        3442030 A1       2/2019
JP     2012-501037 A       1/2012
(Continued)

OTHER PUBLICATIONS

Mayumi Kawana et al., "Magnetic Nanowire Memory Utilizing Motion of Magnetic Domains for Developing a High-speed Recording Device," NHK R&D No. 160 201611.
(Continued)

*Primary Examiner* — Connie C Yoha
(74) *Attorney, Agent, or Firm* — Harness, Dickey & Pierce, P.L.C.

(57) ABSTRACT

A race track magnetic memory device includes a magnetic fine wire having a plurality of magnetic domains, a magnetic tunnel junction element comprising a pinned layer and an insulating layer, and a spin-orbit torque (SOT) generator. An easy axis of the magnetic fine wire is substantially perpendicular to a contact surface of the magnetic fine wire and the SOT generator. The magnetic tunnel junction element and the SOT generator are disposed on a magnetic domain write region of the magnetic fine wire. Data is written by generating spin-transfer torque at magnetization of the magnetic domain write region by flowing a first current in the magnetic tunnel junction element and by generating spin-orbit torque at the magnetization of the magnetic domain write region by flowing a second current in the SOT generator.

20 Claims, 8 Drawing Sheets

(51) Int. Cl.
  *H01L 43/04* (2006.01)
  *G11C 11/18* (2006.01)
  *H01L 43/06* (2006.01)
  *H01L 43/10* (2006.01)

(52) U.S. Cl.
  CPC ............ *H01L 27/222* (2013.01); *H01L 43/04* (2013.01); *H01L 43/06* (2013.01); *H01L 43/10* (2013.01)

(56) References Cited

U.S. PATENT DOCUMENTS

| | | | |
|---|---|---|---|
| 9,858,974 B1* | 1/2018 | Kondo | ................ G11C 11/1673 |
| 10,211,394 B1 | 2/2019 | Inokuchi et al. | |
| 10,529,914 B2 | 1/2020 | Kakinuma et al. | |
| 2020/0176043 A1 | 6/2020 | Shiokawa et al. | |
| 2020/0294565 A1* | 9/2020 | Apalkov | .............. G11C 11/1675 |
| 2021/0028228 A1* | 1/2021 | Lee | ....................... H01F 10/329 |

FOREIGN PATENT DOCUMENTS

| | | |
|---|---|---|
| JP | 2017-112351 A | 6/2017 |
| JP | 2019-036596 A | 3/2019 |
| JP | 2019-057597 A | 4/2019 |

OTHER PUBLICATIONS

S.S.P Parkin et al., "Magnetic Domain-Wall Racetrack Memory," Science vol. 320, 190 (2008).
Daichi Chiba et al., "Control of Multiple Magnetic Domain Walls by Current in a Co/Ni Nano-Wire", Applied Physics Express 3 (2010) 073004.

* cited by examiner

RACE TRACK MAGNETIC MEMORY DEVICE AND WRITING METHOD THEREOF

CROSS-REFERENCE TO RELATED APPLICATION

This U.S. non-provisional patent application claims priority under 35 U.S.C. § 119 to Japanese Patent Application No. 2019-196645, filed on Oct. 29, 2019, in the Japan Patent Office, the disclosure of which is hereby incorporated by reference in its entirety.

BACKGROUND

Example embodiments of inventive concepts relate, in general, to a race track magnetic memory device and/or a writing method thereof, and more particularly, to a race track magnetic memory device capable of moving a magnetic domain wall by applying a current, and/or a writing method thereof.

Patent document 1 discloses a race track magnetic memory device having a track including a magnetic material. A magnetic domain wall may move along the track by a write current flowing through the track.

Patent Document

[Patent document 1] Japanese Patent Publication No. 2012-501037

The race track magnetic memory device may write data by generating a magnetic domain while moving the magnetic domain wall along the track by the write current flowing through the track.

There is a method of writing data by injecting spins to reverse a magnetization direction of a magnetic material. This method uses spin-transfer torque (STT) or spin-orbit torque (SOT). Write currents of these methods are less than that of the race track magnetic memory device.

However, if a magnetization direction of the magnetic material is reversed using the spin-orbit torque in the race track magnetic memory device, a write width may widen by the movement of the magnetic domain wall along the track, and thus data may not be written stably. In addition, a magnetization direction of a ferromagnetic layer having perpendicular magnetic anisotropy may not be reversed using the spin-orbit torque.

Alternatively or additionally the magnetization direction of the magnetic material is reversed using the spin-transfer torque in the race track magnetic memory device, power consumption may be great because a current penetrates an insulator. In addition, to reverse the magnetization direction, providing a large or a great write current for a long time may be necessary or required.

SUMMARY

Example embodiments of inventive concepts may provide a race track magnetic memory device and/or a writing method thereof, which are capable of inhibiting and/or reducing a magnitude of a write current.

According to some example embodiments, a race track magnetic memory device may include a magnetic fine wire having a plurality of magnetic domains, the magnetic fine wire configured to operate as a magnetic domain wall movement type memory, the magnetic domain wall movement type memory configured to move a magnetic domain wall by flowing a current in the magnetic fine wire, a magnetic tunnel junction element including a pinned layer and an insulating layer, and a spin-orbit torque (SOT) generator. An easy axis of the magnetic fine wire is substantially perpendicular to a contact surface of the magnetic fine wire and the SOT generator, the magnetic tunnel junction element and the SOT generator are on a magnetic domain write region of the magnetic fine wire, and the race track memory is configured to write data by generating spin-transfer torque at a magnetization of the magnetic domain write region, the spin-transfer torque generated by flowing a first current in the magnetic tunnel junction element, and the race track memory is configured to write the data by generating spin-orbit torque at the magnetization of the magnetic domain write region, the spin-orbit torque generated by flowing a second current in the SOT generator.

Due to the above, a write current using the spin-transfer torque and the spin-orbit torque may be less than a write current flowing in a track. Thus, a magnitude of the write current may be affected, e.g., inhibited or reduced. Alternatively or additionally, an increase in write width may be inhibited and thus, data may be written more stably. Additionally or alternatively, an amount and/or applying time of a write current necessary for writing in the memory device may be less than that of a device using only one of the spin-transfer torque and the spin-orbit torque.

In some example embodiments, the writing of the data may include starting to flow the second current in the SOT generator at a STT start time point corresponding to a time at which the flowing of the first current in the magnetic tunnel junction element is started. Alternatively or additionally, the writing of the data may occur after the STT start time point.

Thus, the movement of the magnetic domain wall may be started by the spin-orbit torque simultaneously with, or after, spin injection for the spin-transfer torque. As a result, the influence on the movement of the magnetic domain wall may be affected, e.g., inhibited or reduced.

In some example embodiments, the writing of the data may include finishing the flowing of the second current in the SOT generator after a STT finish time point corresponding to a time at which the flowing of the first current in the magnetic tunnel junction element is finished.

By this configuration, the flowing of the current in the SOT generator may be finished after the STT finish time point corresponding to a time at which the flowing of the current in the magnetic tunnel junction element is finished. As a result, a magnitude of the current flowing in the magnetic tunnel junction element may be affected, e.g., inhibited and/or reduced, and thus the magnitude of the write current may be inhibited and/or reduced.

In some example embodiments, the writing of the data may include applying a voltage to the magnetic fine wire to affect, e.g., reduce a magnitude of magnetic anisotropy of the magnetic domain write region.

Since the magnetic anisotropy of the magnetic domain write region is reduced, the magnitude of the write current may be inhibited or reduced.

In some example embodiments, the magnetic fine wire may have a ring shape. The easy axis of the magnetic fine wire may be substantially perpendicular to the contact surface of the magnetic fine wire and the SOT generator, and may be parallel to a ring-shaped surface defined by the ring shape, or in a whole of the ring shape.

Accordingly, data may be written in the 3D-structural magnetic fine wire by the combination of the spin-transfer torque and the spin-orbit torque. Thus, data (write) efficiency of the memory device may be higher than/greater than that of a typical race track magnetic memory. Alternatively or additionally, the right turn, the left turn and/or the fast forward of magnetic domain wall (or magnetic domain) data may be performed by controlling a direction of a SOT current, a direction of a current for moving the magnetic domain wall, and/or magnitudes of the currents. Furthermore, high-speed and/or low-current write operation may be performed by controlling the directions and/or the magnitudes of the currents.

Some example embodiments of inventive concepts may provide a method of writing a race track magnetic memory device. that includes a magnetic fine wire having a plurality of magnetic domains, the magnetic fine wire configured as a magnetic domain wall movement type memory configured to move a magnetic domain wall by flowing a current in the magnetic fine wire, a magnetic tunnel junction element comprising a pinned layer and an insulating layer, and a spin-orbit torque (SOT) generator, wherein an easy axis of the magnetic fine wire is substantially perpendicular to a contact surface of the magnetic fine wire and the SOT generator and wherein the magnetic tunnel junction element and the SOT generator are on a magnetic domain write region of the magnetic fine wire. The method includes flowing a first current in the magnetic tunnel junction element to generate spin-transfer torque at magnetization of the magnetic domain write region, and flowing a second current in the SOT generator to generate spin-orbit torque at the magnetization of the magnetic domain write region.

By these configurations, the write current using the spin-transfer torque and/or the spin-orbit torque may be less than a write current flowing in a track. Thus, the magnitude of the write current may be inhibited or reduced. Alternatively or additionally, an increase in write width may be inhibited and thus, it may be possible to stably write data.

BRIEF DESCRIPTION OF THE DRAWINGS

Inventive concepts will become more apparent in view of the attached drawings and accompanying detailed description.

DETAILED DESCRIPTION OF EXAMPLE EMBODIMENTS

Hereinafter, some example embodiments of inventive concepts will be described in detail with reference to the accompanying drawings.

Although non-limiting example embodiments are described herein separately, one of ordinary skill in the art may recognize that embodiments are not limited explicitly to the described embodiments. Furthermore, unless explicitly stated, example embodiments are not to be construed as being mutually exclusive. For example, some example embodiments may include features of the variously described embodiments, and inventive concepts are not limited thereto.

Embodiment 1

Figure 1:
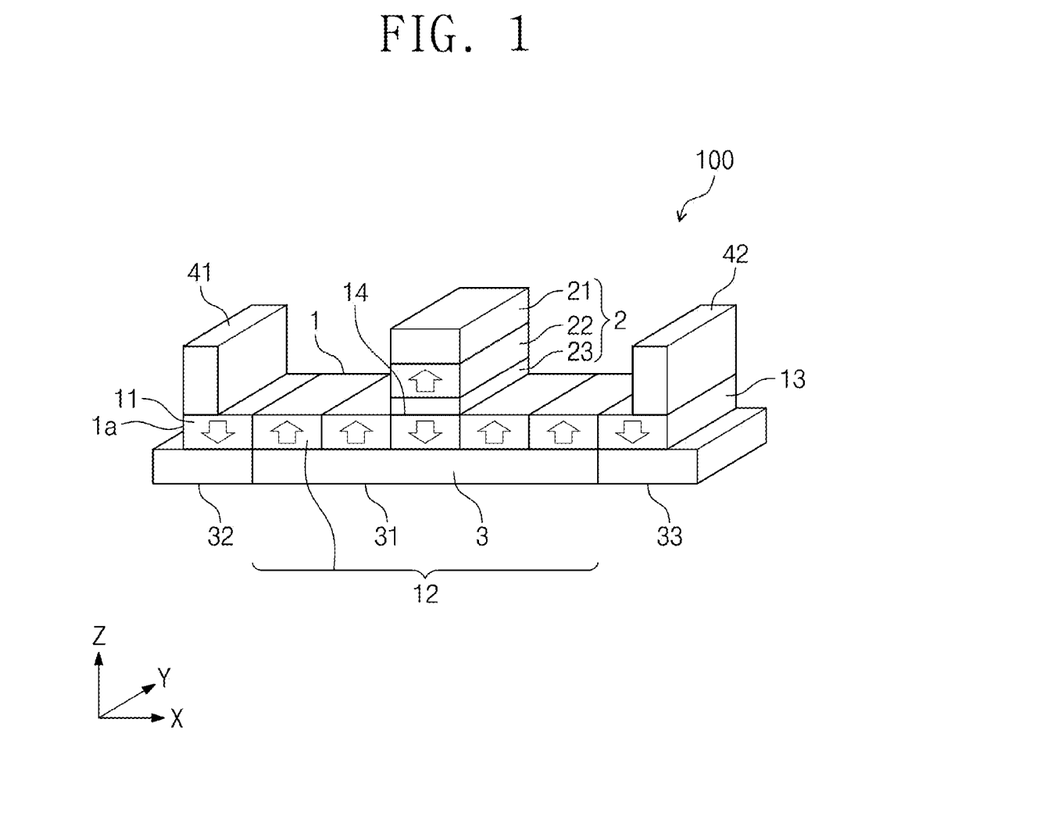
FIG. 1 is a perspective view illustrating a race track magnetic memory device according to some example embodiments of inventive concepts.

FIG. 1 is a perspective view illustrating a race track magnetic memory device according to some example embodiments of inventive concepts. A race track magnetic memory device 100 may include a magnetic body 1, a magnetic tunnel junction (MTJ) element 2, and a spin-orbit torque (SOT) generator 3.

An XYZ Cartesian coordinate system used in FIG. 1 and other drawings is conveniently used to describe the positional relation of components. Generally, a Z-axis direction may be or correspond to a vertical direction, and an XY plane may be a horizontal plane.

The magnetic body 1 may have at least one of various shapes. The magnetic body 1 illustrated in FIG. 1 may be or include a magnetic fine wire which has a fine and long shape, and is formed of a magnetic material. The magnetic body 1 of FIG. 1 may extend along a straight line (e.g., an X axis). A cross section of the magnetic fine wire of the magnetic body 1 illustrated in FIG. 1 has a quadrilateral shape. However, example embodiments are not limited thereto, and the magnetic fine wire of the magnetic body 1 may have one of other various cross-sectional shapes. For example, unlike FIG. 1, the cross section of the magnetic fine wire of the magnetic body 1 may have a circular or elliptical shape. A current flowing in the magnetic body 1 may move a magnetic domain walls (e.g. one or more boundaries between domains (i.e., magnetic domains) having constant magnetization directions), and thus the magnetic body 1 may function as a magnetic domain wall movement type memory. The magnetic body 1 may be formed of a ferromagnetic metal material having perpendicular magnetic anisotropy. For example, the magnetic body 1 may be formed of at least one of a Co/Ni multi-layer, a CoNi-based alloy, a Co/Pd multi-layer, a CoPd alloy, a Co/Pt multi-layer, a CoPt alloy, a Tb/FeCo multi-layer, a TbFeCo alloy, a CoFe alloy, a CoFeB alloy, or a FeNi alloy.

An easy axis of the magnetic body 1 may be substantially parallel to a specific direction (e.g., the Z-axis direction), and perpendicular to an imaginary plane (e.g., the XY plane) including the magnetic body 1. Referring to FIG. 1, a plurality of magnetic domains 1a may be continuously formed in the magnetic body 1. The magnetic domain wall may be formed between the magnetic domains 1a. A position of the magnetic domain, a position of the magnetic domain wall, and/or a size of the magnetic domain wall may be dependent on written data.

Referring to FIG. 1, a width of the magnetic body 1 may be/correspond to a length in a Y-axis direction. A thickness of the magnetic body 1 may be/correspond to a length in the Z-axis direction. In some example embodiments, the width of the magnetic body 1 may be equal to a width of the MTJ element 2 (i.e., a length of the MTJ element 2 in the Y-axis direction); however, example embodiments are not limited thereto. In certain embodiments, the width of the magnetic body 1 may be equal to or less than the width of the MTJ element 2.

The magnetic body 1 may include a first magnetic region 11, a second magnetic region 12, and a third magnetic region 13. The magnetic body 1 may have a magnetic domain write region 14. The magnetic domain write region 14 may be a portion of a surface of the second magnetic region 12. The second magnetic region 12 may be in contact with the SOT generator 3. The magnetic domain write region 14 may be in contact with the MTJ element 2. Either or both of a contact surface of the magnetic domain write region 14 and the MTJ element 2 and a contact surface of the second magnetic region 12 and the SOT generator 3 may correspond to spin injection surfaces.

The first magnetic region 11, the second magnetic region 12 and the third magnetic region 13 may be connected to each other in the order listed. A length of the first magnetic region 11 in a longitudinal direction (e.g., the X-axis direction) of the magnetic body 1 may be close to zero. A length of the second magnetic region 12 in the longitudinal direction (e.g., the X-axis direction) may be equal to or greater than a length of the magnetic domain write region 14 (e.g., a length of the magnetic domain write region 14 in the X-axis direction). A length of the third magnetic region 13 in the longitudinal direction (e.g., the X-axis direction) may be close to zero, and may be the same as, or different from, the length 11. A sum of the lengths of the first, second and third magnetic regions 11, 12 and 13 may be great; however, example embodiments are not limited thereto.

The MTJ element 2 may be disposed on the surface of the second magnetic region 12 so as to be in contact with, e.g. direct contact with, the magnetic domain write region 14. The MTJ element 2 may generate spin-transfer torque at magnetization of the magnetic domain write region 14. For example, the MTJ element 2 may provide the spin-transfer torque to the magnetic domain write region 14.

The MTJ element 2 may include a connection terminal 21, a pinned layer 22, and an insulating layer 23. The insulating layer 23, the pinned layer 22 and the connection terminal 21 may be sequentially stacked on the magnetic domain write region 14. A power source (not shown) may be connected to the connection terminal 21, to supply a write current to the connection terminal 21. The pinned layer 22 may be formed of a ferromagnetic material. The insulating layer 23 may be formed of a non-magnetic insulating material. The insulating layer 23 may be in contact with (e.g. in direct contact with) the magnetic domain write region 14.

The pinned layer 22 may be a ferromagnetic metal layer of which a magnetization direction is fixed or pinned. For example, the pinned layer 22 may be formed of at least one of CoFeB, a CoFe alloy, a Fe-based material, a Co/Pt multi-layer, or a composite layer thereof.

The insulating layer 23 may include an insulating material, for example as a main component thereof. The insulating layer 23 may be formed between the pinned layer 22 and the second magnetic region 12. The insulating layer 23 may be formed of an insulating material such as MgO. In addition, the insulating layer 23 may include an oxide having a NaCl structure. The insulating layer 23 may include, but not limited to, CaO, SrO, TiO, VO, or NbO except MgO described above. The insulating layer 23 may include at least one of other insulating materials capable of functioning as the insulating layer 23. For example, the insulating layer 23 may include spinel-type $MgAl_2O_4$.

The pinned layer 22, the insulating layer 23, and the second magnetic region 12 may form a magnetic tunnel junction, and thus may function as an element for performing at least one of a write operation or a read operation.

The SOT generator 3 may generate spin-orbit torque for changing a magnetization direction of the magnetic domain write region 14. For example, the SOT generator 3 may provide the spin-orbit torque to the magnetic domain write region 14. However, the spin-orbit torque may also change a magnetization direction in each of the magnetic domains of the second magnetic region 12. A current may flow in the SOT generator 3 in a direction intersecting the easy axis of the second magnetic region 12, and thus the SOT generator 3 may inject a polarized spin current into the second magnetic region 12 to generate the spin-orbit torque. Referring to FIG. 1, the current may flow in the SOT generator 3 in the X-axis direction, and spins polarized in the Y-axis direction intersecting the Z-axis direction may be injected into the second magnetic region 12. Thus, the spin-orbit torque may generate a magnetization in the second magnetic region 12. The current flowing in the SOT generator 3 may not have the same magnitude as the current flowing in the MTJ element 2. For example, the magnitude of the current flowing in the SOT generator 3 may be greater or less than the magnitude of the current flowing in the MTJ element 2. When the current flowing in the SOT generator 3 and the current flowing in the MTJ element 2 are appropriately changed, the magnetization direction of the magnetic domain write region 14 may be more, or more exactly, reversed by 180 degrees, by the spin-transfer torque. The spin-transfer torque may tend to reverse the magnetization direction of the magnetic domain write region by 180 degrees from an initial magnetization direction thereof. Alternatively, the spin-orbit torque tends to change the magnetization direction of the magnetic domain write region 14 by 90 degrees from a direction of the easy axis. In some example embodiments, the magnitude of the current flowing in the SOT generator 3 may be less than the magnitude of the current flowing in the MTJ element 2.

Here, intersection such as intersecting directions means non-parallel such as non-parallel, although not necessarily perpendicular, directions. For example, the polarization direction of the spin current injected from the SOT generator 3 is not parallel to the easy axis of the second magnetic region 12. For example, an intersection angle of the easy axis of the second magnetic region 12 and the polarization direction of the spin current injected from the SOT generator 3 may be greater than 0 degree and less than 360 degrees. The intersection angle may be equal to or greater than 45 degrees, and may efficiently change the magnetization direction of the magnetic domain write region 14 by the spin current. In particular, the intersection angle may be equal to or greater than 80 degrees. In more particular, the intersection angle may be a right angle or an approximate right angle. For example, the approximate right angle may be an angle of 88 degrees to 92 degrees. The polarization direction of the spin current injected from the SOT generator 3 may be the same direction as an outer product of a direction of the current flowing in the SOT generator 3 and a direction of the spin current.

Thus, the contact surface of the SOT generator 3 and the second magnetic region 12 may intersect the easy axis of the second magnetic region 12.

The SOT generator 3 may include a SOT interconnection line 31 and first and second connection terminals 32 and 33.

The first and second connection terminals 32 and 33 may be connected to the same or different power sources (not shown) to supply the current for generating the spin-orbit torque (SOT). The SOT generator 3 may generate the spin-orbit torque at the magnetization in the second magnetic region 12 by providing the current from the first connection terminal 32 to the second connection terminal 33 through the SOT interconnection line 31. The first connection terminal 32 and the second connection terminal 33 may be disposed outside a region such as a predetermined region of the second magnetic region 12. For example, the first connection terminal 32 and the second connection terminal 33 may be disposed at an end portion and another end portion of the SOT interconnection line 31, respectively. Alternatively or additionally, at least one of the connection terminals 32 and 33 may be used as an electrode of the MTJ element 2.

The SOT generator 3 may have a structure capable of flowing the current for injecting the polarized spin current in a direction intersecting the easy axis of the second magnetic region 12. For example, the first and second connection terminals 32 and 33 may be or include a pair of electrodes spaced apart from each other in a direction intersecting a stacking direction of the SOT interconnection line 31 and the second magnetic region 12. For example, as illustrated in FIG. 1, the first and second connection terminals 32 and 33 may be disposed at both ends of the SOT interconnection line 31 in the X-axis direction, respectively.

The first and second connection terminals 32 and 33 may be formed of or include a conductive material.

The SOT interconnection line 31 may be formed of or include a material capable of generating the spin-orbit torque by flowing a current between the first and second connection terminals 32 and 33. The SOT interconnection line 31 may include a non-magnetic metal. For example, the SOT interconnection line 31 may include a topological insulator. The topological insulator is or includes a material which has an inside formed of an insulating material and a surface capable of conducting electricity. For example, the topological insulator may include semimetal bismuth and/or a bismuth compound. In particular, the topological insulator may include BiTeSb and/or BiSb. The inside of the topological insulator may have conductivity by changing a composition thereof.

The SOT interconnection line 31 may include at least one metal of Rh, Pt, W, or Ta.

The SOT generator 3 may be disposed under the second magnetic region 12, and the MTJ element 2 may be disposed on a top surface of the magnetic domain write region 14. In some example embodiments, unlike FIG. 1, the MTJ element 2 may be disposed on a side surface of the magnetic domain write region 14. In some example embodiments, unlike FIG. 1, the SOT generator 3 may be disposed on the second magnetic region 12, and the MTJ element 2 may be disposed on a bottom surface of the magnetic domain write region 14.

The race track magnetic memory device 100 may further include transfer electrodes 41 and 42. The transfer electrodes 41 and 42 may be disposed at an end and another end of the magnetic body 1, respectively. The transfer electrodes 41 and 42 may be connected to another power source (not shown) different from the power source connected to the connection terminals 32 and 33 and may supply a current for transferring the magnetic domain.

The transfer electrodes 41 and 42 may be formed of or include a conductive material.

The other power source (i.e., the power source connected to the transfer electrodes 41 and 42) may flow a direct current (DC). To control, e.g. to precisely control a position of the magnetic domain, the other power source may supply a current of which a waveform at ON-OFF is close to a square shape, e.g. a shape having a duty cycle of close to or equal to 50%. For example, when an applying time of a current, which is required/used to move the magnetic domain by a 1 bit length, is 't', an applying time of the direct current may be 'nt' (i.e., integer multiple of 't'). A voltage may have a voltage value suitable for a current value for current-driving the magnetic domain. For example, the voltage may be determined by a resistance value of the magnetic body 1 and a movement speed of the magnetic domain wall.

Alternatively or additionally, the race track magnetic memory device 100 may further include a substrate (not shown). The substrate may have, for example, a plate shape extending along an XY imaginary plane illustrated in FIG. 1, and the magnetic body 1, etc. may be disposed on the substrate.

[Writing Method 1]

Figure 2:
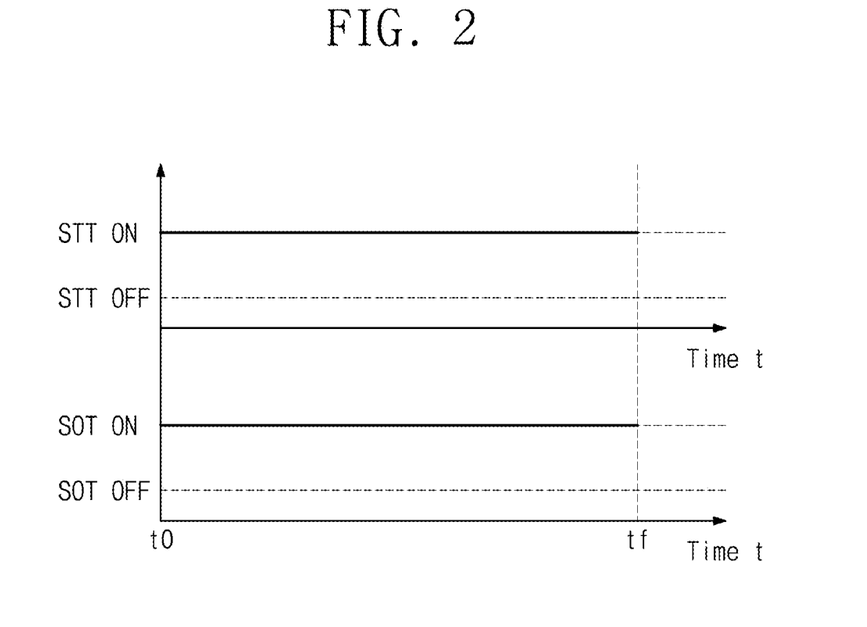
FIG. 2 illustrates an example of a timing chart of spin injection for generating spin-orbit torque and spin-transfer torque.

Next, an example of a writing method of the race track magnetic memory device 100 will be described with reference to FIGS. 1 and 2. FIG. 2 illustrates an example of a timing chart of spin injection for generating spin-orbit torque and spin-transfer torque.

At a time point t0, the spin-transfer torque (STT) may be provided to the magnetic domain write region 14 by flowing a current such as a predetermined current through the MTJ element 2 (a STT injection step (ST1)). Substantially simultaneously with the start of the STT injection step (ST1), the SOT generator 3 may provide the spin-orbit torque (SOT) to the second magnetic region 12 (a SOT injection step (ST2)). For example, both the SOT injection step (ST2) and the STT injection step (ST1) may be started at the time point t0 and may be started substantially simultaneously. The STT injection step (ST1) and the SOT injection step (ST2) may be continuously performed. Thus, the magnetization direction of the magnetic domain write region 14 may be changed to write data in the magnetic body 1. The STT injection step (ST1) and the SOT injection step (ST2) may be finished at a time point tf.

[Writing Method 2]

Figure 3:
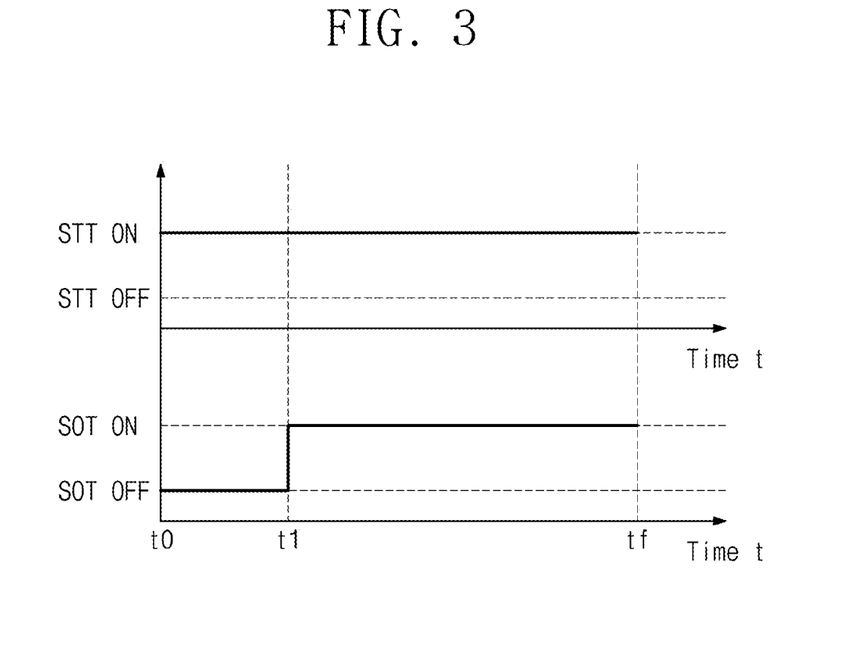
FIG. 3 illustrates an example of a timing chart of spin injection for generating spin-orbit torque and spin-transfer torque.

Next, another example of the writing method of the race track magnetic memory device 100 will be described with reference to FIGS. 1 and 3. FIG. 3 illustrates another example of a timing chart of spin injection for generating spin-orbit torque and spin-transfer torque.

At a time point t0, the spin-transfer torque (STT) may be provided to the magnetic domain write region 14 by flowing a current such as a predetermined current through the MTJ element 2 (a STT injection step (ST1)). At a time point t1 when a time such as the predetermined time has elapsed after the start of the STT injection step (ST1), the SOT generator 3 may provide the spin-orbit torque to the second magnetic region 12 (a SOT injection step (ST2)). For example, the time point t1 corresponding to a time point of the start of the SOT injection step (ST2) may be after the time point t0 corresponding to a time point of the start of the STT injection step (ST1). The STT injection step (ST1) and the SOT injection step (ST2) may be continuously performed. Thus, the magnetization direction of the magnetic domain write region 14 may be reversed to write data in the magnetic body 1. The STT injection step (ST1) and the SOT injection step (ST2) may be finished at a time point tf.

In the writing method 2, because the SOT injection step (ST2) is started at the time point t1 when the time (e.g. the predetermined time) has elapsed from the time point t0 of the start of the STT injection step (ST1), the influence of the SOT injection step (ST2) on movement of the magnetic domain wall may be small as compared with the writing method 1 described above. Thus, the magnetization direction of the magnetic domain write region 14 may be more stably reversed to write data in the magnetic body 1.

Figure 4:
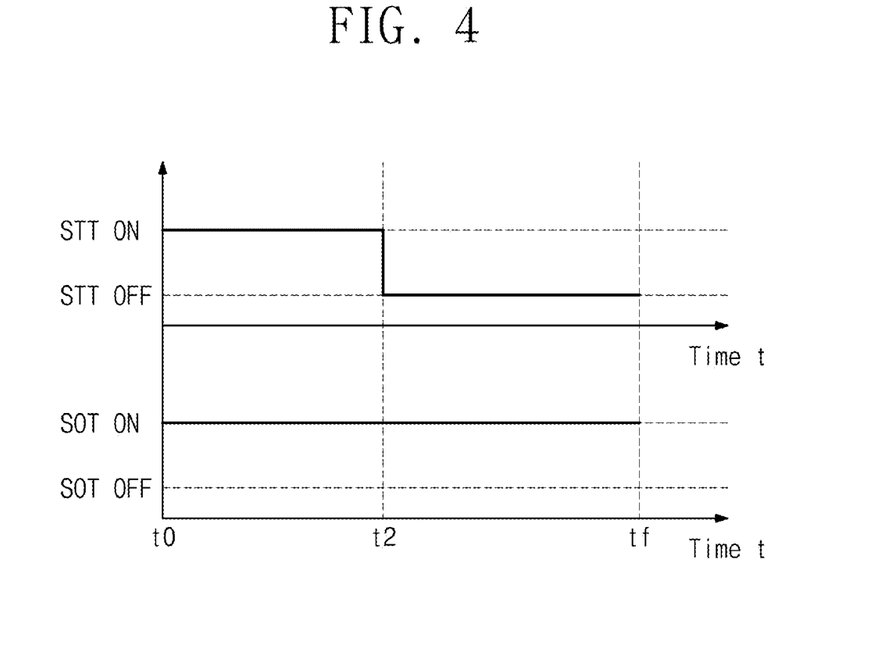
FIG. 4 illustrates an example of a timing chart of spin injection for generating spin-orbit torque and spin-transfer torque.

FIG. 4 illustrates another example of a timing chart of spin injection for generating spin-orbit torque and spin-transfer torque. As illustrated in FIG. 4, the STT injection step (ST1) may be finished at a time point t2 when a time (such as a predetermined time) has elapsed after starting the STT injection step (ST1) and the SOT injection step (ST2) (i.e., after the time point t0). The SOT injection step (ST2) may be continuously performed. Because the STT injection step (ST1) is first finished before the finish of the SOT injection step (ST2), power consumption of the write operation may be reduced/small.

A voltage such as a predetermined voltage may be applied to the magnetic body 1 after a time such as a predetermined time has passed from the time point t0 of the start of the STT injection step (ST1). Magnetic anisotropy of the magnetic domain write region 14 may be reduced by applying the predetermined voltage to the magnetic body 1.

[Simulation Result]

Figure 5:
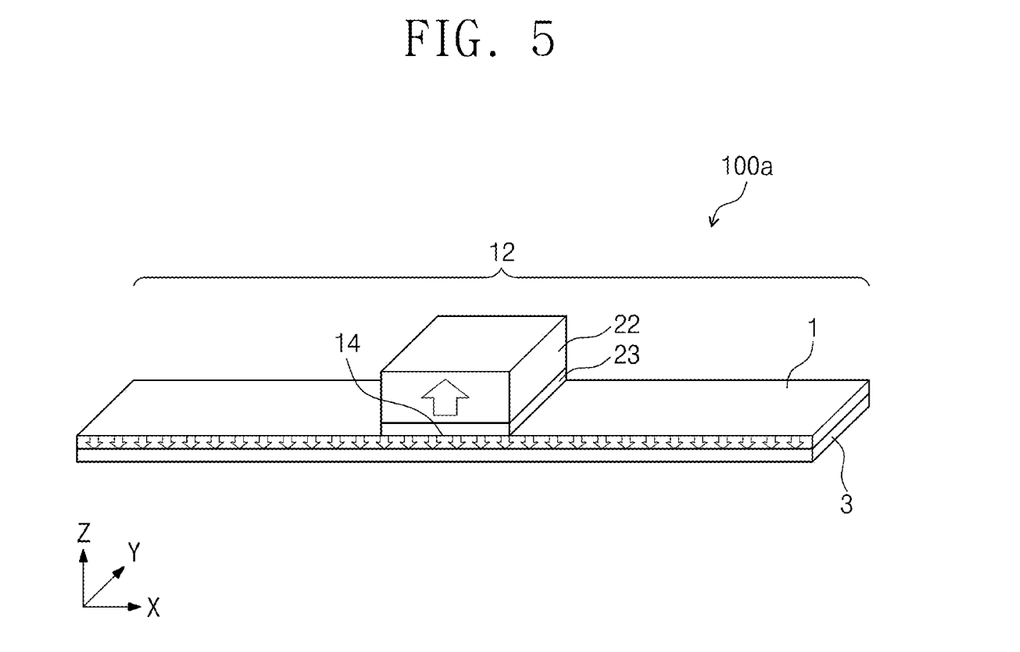
FIG. 5 is a perspective view illustrating a model used for simulation of a race track magnetic memory device according to some example embodiments of inventive concepts.

Next, simulation results will be described with reference to a race track magnetic memory device 100a. Particularly, simulation results for an operation of writing data in the race track magnetic memory device 100a will be described. FIG. 5 is a perspective view illustrating a model used for simulation of a race track magnetic memory device according to some example embodiments of inventive concepts.

As illustrated in FIG. 5, the race track magnetic memory device 100a may include the second magnetic region 12, the pinned layer 22, the insulating layer 23, and the SOT generator 3, like the race track magnetic memory device 100 described above.

Figure 6:
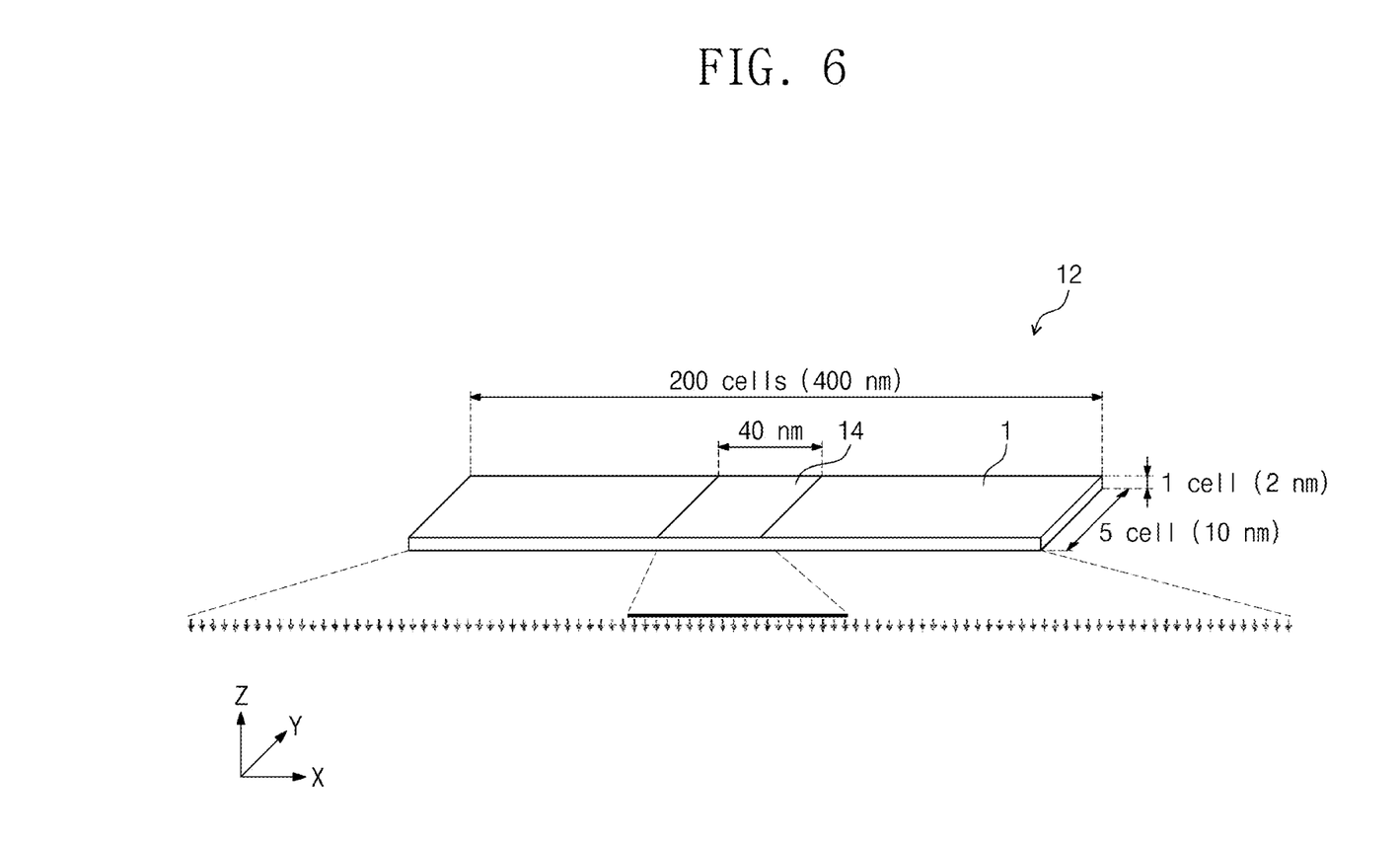
FIG. 6 is a perspective view illustrating a main portion of the model used for the simulation.

A size of the second magnetic region 12 is illustrated in FIG. 6. FIG. 6 is a perspective view illustrating a main portion of the model used for the simulation. The second magnetic region 12 has a layer shape having a length of 200 cells (e.g. 400 nm), a width of 5 cells (e.g. 10 nm), and a thickness of 1 cell (e.g. 2 nm). A length of the magnetic domain write region 14 is 40 nm. The second magnetic region 12 has a magnetic domain structure having a stripe phase magnetized in a direction (e.g., the Z-axis direction) substantially perpendicular to a main plane (e.g., the XY plane). As illustrated in FIGS. 5 and 6, a magnetization direction of the second magnetic region 12 in an initial state is a direction toward the SOT generator 3, i.e., a −Z-axis direction. The second magnetic region 12 is a perpendicular magnetic layer. A magnetization direction of the pinned layer 22 is a direction opposite to the magnetization direction of the second magnetic region 12, i.e., a +Z-axis direction.

Spins in the +Z-axis direction are injected to a surface (e.g., a surface in the +Z-axis direction) of the magnetic domain write region 14 by flowing a current such as a predetermined current in the MTJ element 2, thereby providing spin-transfer torque. Spins in the +Y-axis direction are injected to a bottom surface (e.g., a surface in the −Z-axis direction) of the second magnetic region 12 by flowing a current such as predetermined current in the SOT generator 3, thereby providing spin-orbit torque.

Landau Lifshitz Gilbert (LLG) simulation for an operation of writing data by generating a magnetic domain (bit) in the magnetic domain write region 14 was performed. Magnetic parameters were a saturation magnetization (MS) of 300 kA/m (=300 emu/cc), an exchange stiffness constant of $1.0 \times 10^{-12}$ J/m (=$0.1 \times 10^{-6}$ erg/cm), and uniaxial anisotropy (Ku) of $1.0 \times 10^5$ J/m³ (=$1.0 \times 10^6$ erg/cc).

The current flowing in the MTJ element 2 was $1.0 \times 10^{12}$ A/m². The current flowing in the SOT generator 3 was $0.5 \times 10^{12}$ A/m².

Figure 7:
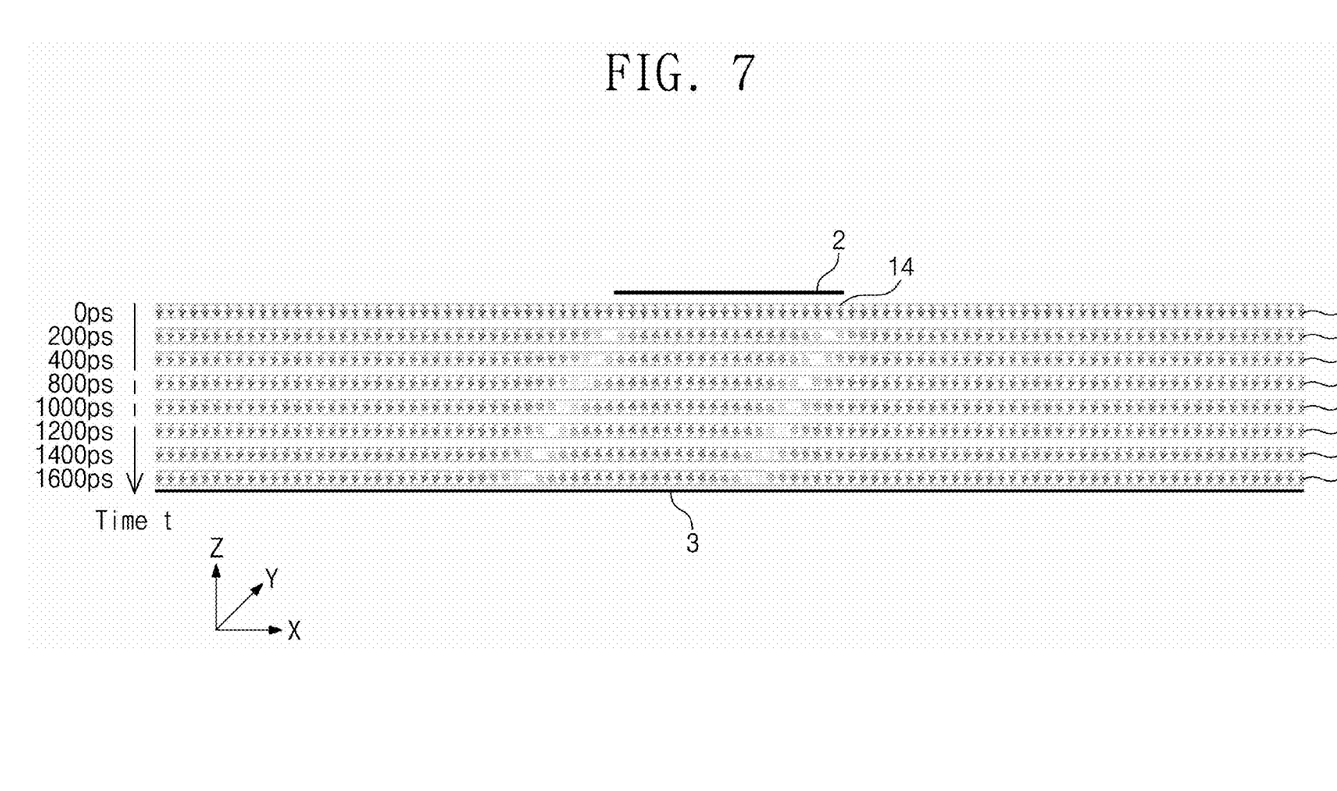
FIG. 7 illustrates simulation results.
Figure 8:
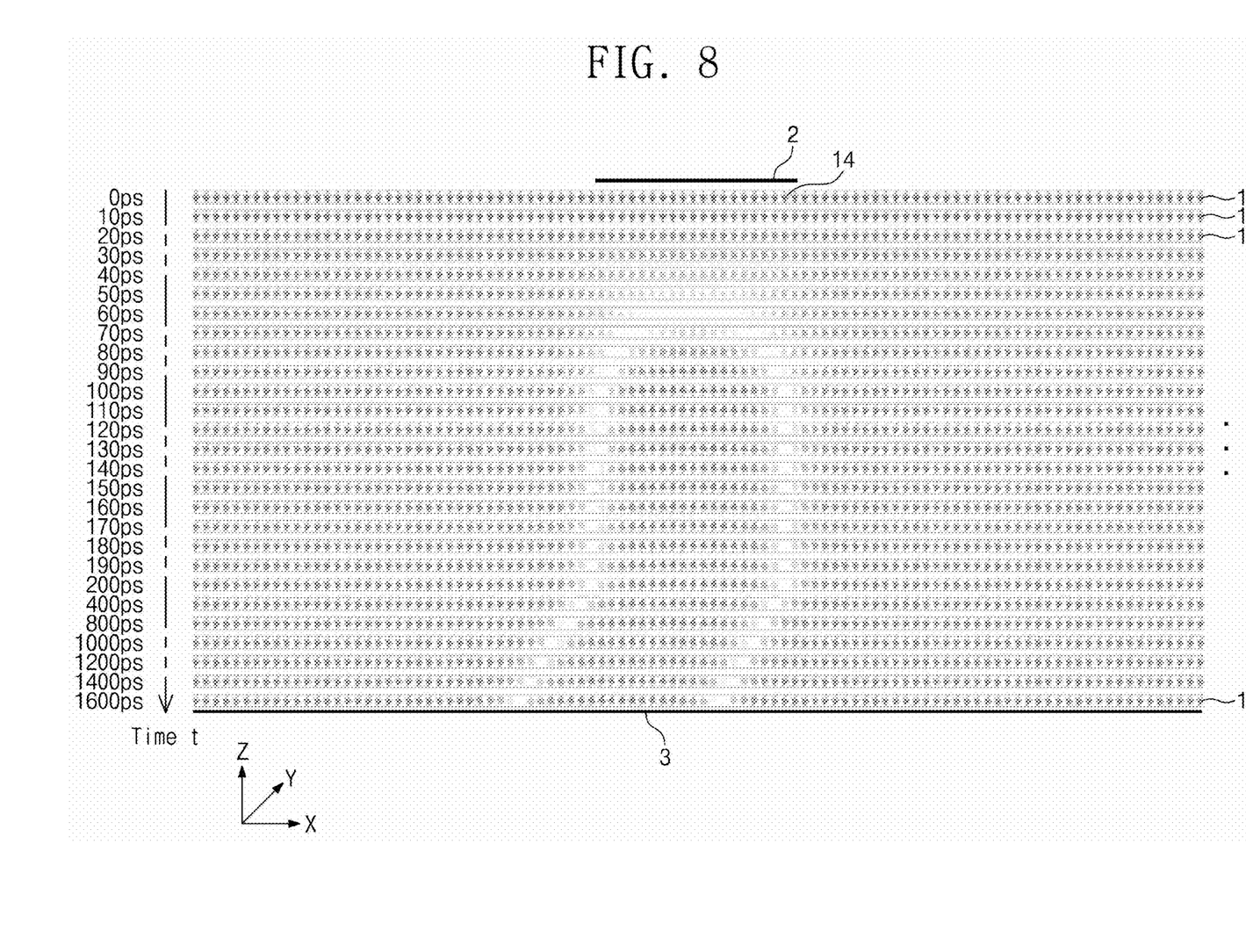
FIG. 8 illustrates simulation results.

FIGS. 7 and 8 illustrate simulation results according to some example embodiments in which the spin-orbit torque and the spin-transfer torque are provided in a time of 0 ps (picosecond) to 100 ps to write data. The magnetization direction of the second magnetic region 12 was calculated every 200 ps until 1600 ps (=1600 picoseconds) elapsed from a time point of start of spin injection. FIG. 7 illustrates that the results, calculated every 200 ps, of the magnetization direction of the second magnetic region 12 are arranged in an axis direction of a time 't'. FIG. 8 illustrates the calculation results of FIG. 7 in more precise time units.

Figure 9:
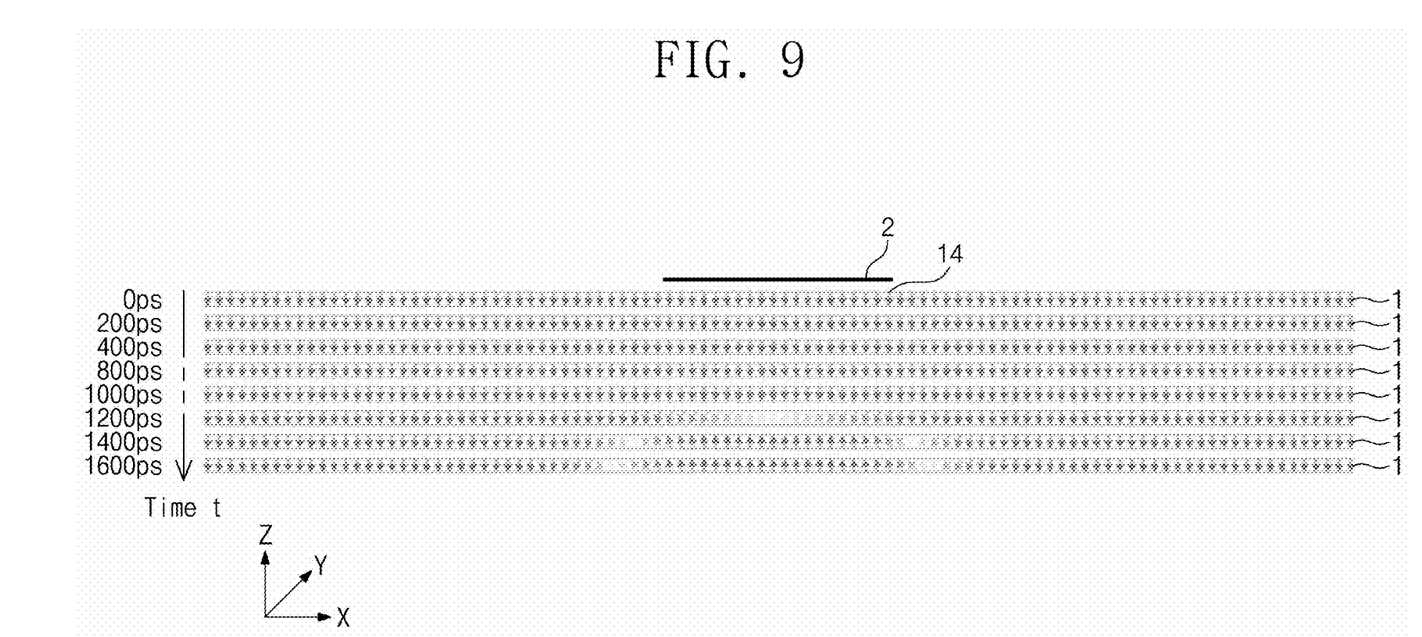
FIG. 9 illustrates simulation results.

FIG. 9 illustrates simulation results according to a comparative example in which the spin-orbit torque is not provided, and only the spin-transfer torque is provided to write data. A magnetization direction of the second magnetic region 12 was calculated at each time point until 1600 ps elapsed from a time point of start of spin injection. FIG. 9 illustrates that the results, calculated every 200 ps, of the magnetization direction of the second magnetic region 12 are arranged in an axis direction of a time 't'.

According to the example embodiments illustrated in FIGS. 7 and 8, reversion of the magnetization direction of the second magnetic region 12 is started at a time point of 20 ps. A region in which the magnetization direction is reversed to face the +Z-axis direction is formed at a time point of 100 ps. A width of this region is substantially equal to the widths of the MTJ element 2 and the magnetic domain write region 14. This region corresponds to a bit. Thus, the bit is generated in the magnetic domain write region 14 at the time point of 100 ps. Most of regions having the magnetization directions facing the +Z-axis direction stay at the same positions and do not move, in a range of the time point of 100 ps to a time point of 200 ps. The region having the magnetization direction facing the +Z-axis direction moves in a range of the time point of 200 ps to a time point of 1600 ps. A write width was equal to the widths of the magnetic domain write region 14 and the MTJ element 2, and did not increase much as time passed.

According to the comparative example illustrated in FIG. 9, at a time point of 1400 ps, the magnetization direction of the second magnetic region 12 is reversed to form a region in which the magnetization direction faces the +Z-axis direction. This region corresponds to a bit. Thus, the bit is generated in the magnetic domain write region 14 at the time point of 1400 ps. Most of regions having the magnetization directions facing the +Z-axis direction stay at the same positions and do not move, in a range of the time point of 1400 ps to a time point of 1600 ps. A write width was greater than the widths of the magnetic domain write region 14 and the MTJ element 2.

The comparative example generated the bit in the magnetic domain write region 14 at the time point of 1400 ps, and example embodiments generated the bit in the magnetic domain write region 14 at the time point of 100 ps. A bit generation time (e.g., a time elapsed until the bit is generated in the magnetic domain write region 14) of example embodiments are shorter than that of the comparative example.

Thus, the race track magnetic memory device according to the embodiment may write data at high speed and/or with low power consumption, as compared with the race track magnetic memory device according to the comparative example. The write width according to example embodiments was less than the write width according to the comparative example. Thus, the race track magnetic memory device according to example embodiments may write data at high density, as compared with the race track magnetic memory device according to the comparative example.

Next, a race track magnetic memory device 100b according to some example embodiments of inventive concepts will be described.

The magnetic body 1 illustrated in FIG. 1 may be the magnetic fine wire which has the long and fine shape and is formed of a magnetic material. The magnetic fine wire may have at least one of various shapes. For example, the magnetic fine wire may have a U-shape, a race track shape, or a ring shape. The magnetic body 1 may have a three-dimensional (3D) shape. For example, the magnetic fine wire may extend in a 3D space. The magnetic body 1 may include a plurality of magnetic domains arranged in the U-shape, the race track shape or the ring shape. The race track magnetic memory device 100b illustrated in FIG. 10 may include a magnetic body 10 corresponding to an example of the magnetic body 1. The magnetic body 10 may have a quadrilateral ring shape or other polygonal ring shapes. The same components as in FIG. 1 will be indicated by the same reference designators, and the detailed descriptions thereto will be omitted.

An easy axis of the magnetic body 10 may be parallel to a direction (e.g., the Z-axis direction) that is parallel to a ring-shaped surface (e.g., an XZ plane) of the magnetic body 10 in the whole of the ring shape. The race track magnetic memory device 100b illustrated in FIG. 10 may include a first magnetic region 11, a second magnetic region 12, a third magnetic region 13, a transfer electrode 41, a transfer electrode 42, a MTJ element 2, a SOT generator 3, and an insulator 15. The first magnetic region 11 may correspond to a left end of a top side and an upper portion of a left side of the magnetic body 10 having the quadrilateral ring shape. The third magnetic region 13 may correspond to a right end of the top side, a right side, a bottom side, and a lower portion of the left side of the magnetic body 10 having the quadrilateral ring shape. The ring-shaped surface (e.g., the XZ plane) of the magnetic body 10 may be perpendicular to the horizontal plane (i.e., the XY plane) of FIG. 1.

Figure 10:
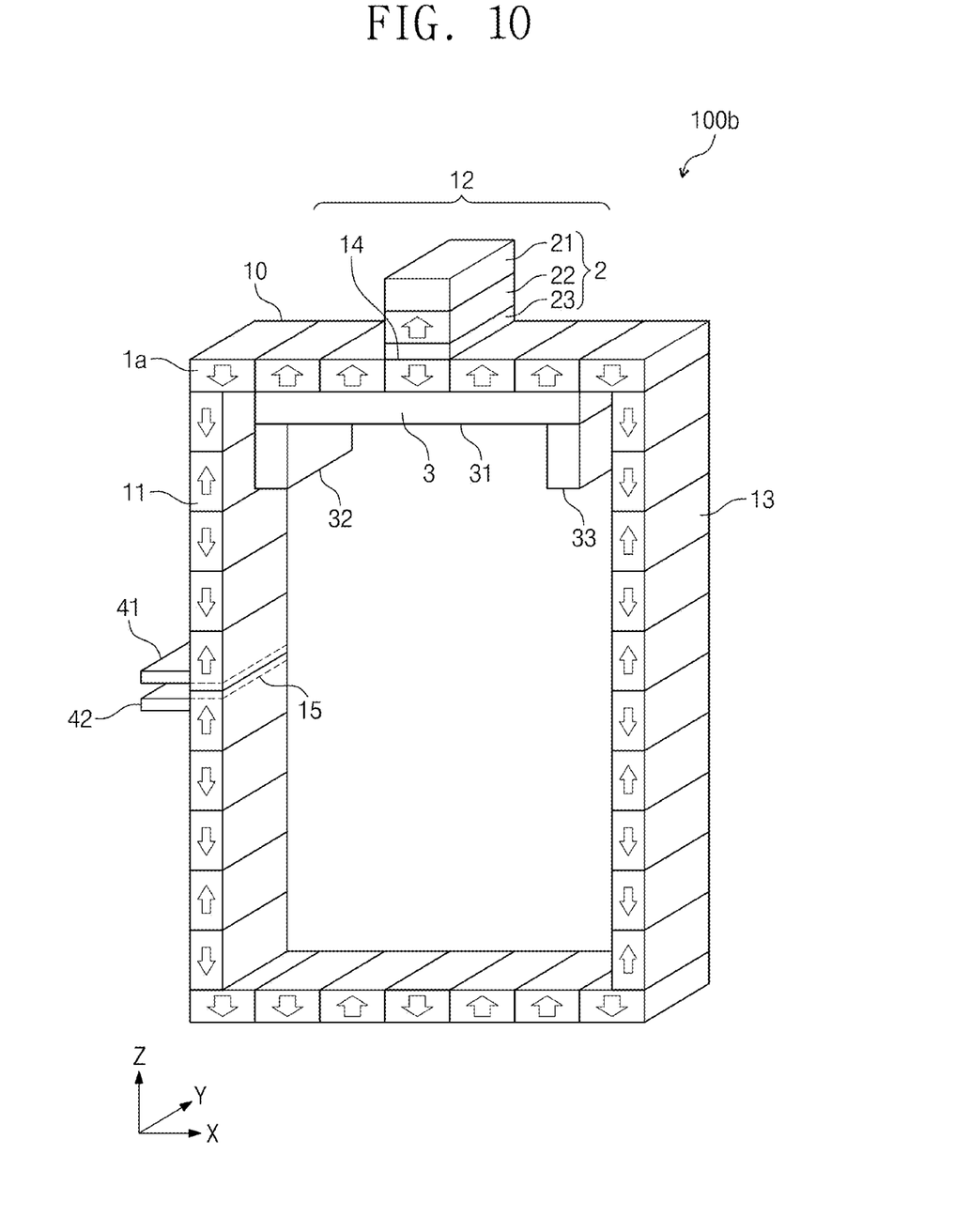
FIG. 10 is a perspective view illustrating a race track magnetic memory device according to some example embodiments of inventive concepts.

The insulator 15 may be structurally connected to the first magnetic region 11 and the third magnetic region 13 at both ends of the magnetic body 10.

The first magnetic region 11, the second magnetic region 12, the third magnetic region 13 and the insulator 15 may form a ring shape. The insulator 15 may be a ferromagnetic insulator. For example, the insulator 15 may be formed of or include at least one of yttrium iron garnet (YIG), $CoFeO_4$, $BaFeO$, or $BiFeO_3$.

A length of the insulator 15 in a ring shape direction (e.g., a thickness of the insulator 15 in the Z-axis direction) may be so short that a current does not flow therethrough. The thickness of the insulator 15 may be, for example, about 8 nm.

The first magnetic region 11, the second magnetic region 12 and the third magnetic region 13 may be arranged in the order listed. When the insulator 15 is structurally connected to the first magnetic region 11 and the third magnetic region 13, the first, second and third magnetic regions 11, 12 and 13 and the insulator 15 may cover all positions of the ring-shaped structure.

The SOT generator 3 may be disposed on an inner circumferential surface of the second magnetic region 12. In some example embodiments, unlike FIG. 10, the SOT generator 3 may be disposed on an outer circumferential surface of the second magnetic region 12. The MTJ element 2 may be disposed on an outer circumferential surface of the magnetic domain write region 14. In some example embodiments, unlike FIG. 10, the MTJ element 2 may be disposed on a side surface of the magnetic domain write region 14 or may be disposed on an inner circumferential surface of the magnetic domain write region 14.

For example, the transfer electrodes 41 and 42 may be connected to a power source (not shown) to supply a current to the magnetic body 10. A magnetic domain wall or magnetic domain moved from the inside of the first magnetic region 11 to a junction of the first magnetic region 11 and the insulator 15 may pass through the insulator 15 and then may move into the third magnetic region 13.

A magnetic domain wall or magnetic domain moved from the inside of the third magnetic region 13 to a junction of the third magnetic region 13 and the insulator 15 may pass through the insulator 15 and then may move into the first magnetic region 11.

Alternatively or additionally, the race track magnetic memory device 100b may further include a substrate (not shown). The substrate may have, for example, a plate shape extending along an XY imaginary plane illustrated in FIG. 10, and the magnetic body 10, etc. may be disposed on the substrate. The magnetic body 10 may stand on the substrate (e.g., in such a way that the ring-shaped surface (e.g., the XZ plane) of the magnetic body 10 is substantially perpendicular to a top surface of the substrate). For example, the magnetic body 10 may be disposed in a 3D space on the substrate. The magnetic body 10 may be combined with the 3D structure to provide a high data write efficiency, as compared with a typical race track magnetic memory. In addition, the right turn, the left turn and/or the fast forward of magnetic domain wall (or magnetic domain) data may be performed by controlling a direction of a SOT current, a direction of a current for moving the magnetic domain wall, and/or magnitudes of the currents. Furthermore, high-speed and low-current write operation may be performed by controlling the directions and/or the magnitudes of the currents.

The embodiments of inventive concepts may provide the race track magnetic memory device capable of reducing the magnitude of the write current.

However, inventive concepts are not limited to the above embodiments, and the embodiments may be variously changed or modified without departing from the spirits and scopes of inventive concepts.

What is claimed is:

1. A race track magnetic memory device comprising:
a magnetic fine wire having a plurality of magnetic domains, the magnetic fine wire configured to operate as a magnetic domain wall movement type memory, the magnetic domain wall movement type memory configured to move a magnetic domain wall by flowing a current in the magnetic fine wire;
a magnetic tunnel junction element including a pinned layer and an insulating layer; and
a spin-orbit torque (SOT) generator,
wherein an easy axis of the magnetic fine wire is substantially perpendicular to a contact surface of the magnetic fine wire and the SOT generator, the magnetic tunnel junction element and the SOT generator are on a magnetic domain write region of the magnetic fine wire, and the race track memory is configured to write data by generating spin-transfer torque at a magnetization of the magnetic domain write region, the spin-transfer torque generated by flowing a first current in the magnetic tunnel junction element, and the race track memory is configured to write the data by generating spin-orbit torque at the magnetization of the magnetic domain write region, the spin-orbit torque generated by flowing a second current in the SOT generator.

2. The race track magnetic memory device of claim 1, wherein the race track magnetic memory device is configured to write the data by:

starting to flow the second current in the SOT generator at a STT start time or after the STT start time point, the STT start time corresponding to a time point at which the race track magnetic memory starts the flowing of the first current in the magnetic tunnel junction element.

3. The race track magnetic memory device of claim 2, wherein the race track magnetic memory is configured to write the data by:

finishing the flowing of the second current in the SOT generator after an STT finish time, the STT finish time corresponding to a time point at which the race track magnetic memory finishes the flowing of the first current in the magnetic tunnel junction element.

4. The race track magnetic memory device of claim 3, wherein the race track magnetic memory is configured to write the data by:

applying a voltage to the magnetic fine wire, the voltage affecting a magnitude of magnetic anisotropy of the magnetic domain write region.

5. The race track magnetic memory device of claim 4, wherein the magnetic fine wire has a ring shape, the easy axis of the magnetic fine wire is substantially perpendicular to the contact surface of the magnetic fine wire and the SOT generator, and the easy axis is parallel to a ring-shaped surface that defines the ring shape.

6. The race track magnetic memory device of claim 3, wherein the magnetic fine wire has a ring shape, and the easy axis of the magnetic fine wire is substantially perpendicular to the contact surface of the magnetic fine wire and the SOT generator and is parallel to a ring-shaped surface that defines the ring shape.

7. The race track magnetic memory device of claim 2, wherein the race track magnetic memory is configured to write the data by:

applying a voltage to the magnetic fine wire to affect a magnitude of magnetic anisotropy of the magnetic domain write region.

8. The race track magnetic memory device of claim 2, wherein the magnetic fine wire has a ring shape, and wherein the easy axis of the magnetic fine wire is substantially perpendicular to the contact surface of the magnetic fine wire and the SOT generator and is parallel to a ring-shaped surface that defines the ring shape.

9. The race track magnetic memory device of claim 1, wherein the race track magnetic memory device is configured to write the data by:

finishing the flowing of the second current in the SOT generator after a STT finish time, the STT finish time corresponding to a time point at which the race track magnetic memory finishes the flowing of the first current in the magnetic tunnel junction element.

10. The race track magnetic memory device of claim 1, wherein the race track magnetic memory is configured to write the data by:

applying a voltage to the magnetic fine wire to affect a magnitude of magnetic anisotropy of the magnetic domain write region.

11. The race track magnetic memory device of claim 1, wherein the magnetic fine wire has a ring shape, and wherein the easy axis of the magnetic fine wire is substantially perpendicular to the contact surface of the magnetic fine wire and the SOT generator and is parallel to a ring-shaped surface that defines the ring shape.

12. A method of writing a race track magnetic memory device that includes a magnetic fine wire having a plurality of magnetic domains, the magnetic fine wire configured as a magnetic domain wall movement type memory configured to move a magnetic domain wall by flowing a current in the magnetic fine wire, a magnetic tunnel junction element comprising a pinned layer and an insulating layer, and a spin-orbit torque (SOT) generator, wherein an easy axis of the magnetic fine wire is substantially perpendicular to a contact surface of the magnetic fine wire and the SOT generator and the magnetic tunnel junction element and the SOT generator are on a magnetic domain write region of the magnetic fine wire, the method comprising:

flowing a first current in the magnetic tunnel junction element to generate spin-transfer torque at magnetization of the magnetic domain write region; and flowing a second current in the SOT generator to generate spin-orbit torque at the magnetization of the magnetic domain write region.

13. The race track magnetic memory device of claim 4, wherein the voltage reduces a magnetic of magnetic anisotropy of the magnetic domain write region.

14. The race track magnetic memory device of claim 1, further comprising:

a first connection terminal connected to the SOT generator and to a first power source; and a second connection terminal connected to the SOT generator and to the first power source, wherein the first connection terminal and the second connection terminal are configured to supply a current to generate the spin-orbit torque.

15. The race track magnetic memory device of claim 14, further comprising:

a first transfer electrode connected to the magnetic fine wire and to a second power source; and a second transfer electrode connected to the magnetic fine wire and to the second power source, wherein the first transfer electrode and the second transfer electrode are configured to supply a current to the magnetic fine wire.

16. The race track magnetic memory device of claim 15, wherein the first transfer electrode and the second transfer electrode are configured to receive a direct current from the second power source.

17. The race track magnetic memory device of claim 1, wherein the magnetic fine wire comprises:

an insulator between a first magnetic region of the magnetic fine wire and a second magnetic region of the magnetic fine wire.

18. The race track magnetic memory device of claim 17, wherein a thickness of the insulator is about 8 nm.

19. The race track magnetic memory device of claim 17, wherein the insulator includes at least one of yttrium iron garnet (YIG), CoFeO4, BaFeO, or BiFeO3.

20. The race track magnetic memory device of claim 5, wherein a first transfer electrode is on an outside of the ring shape.

* * * * *